United States Patent
Butaye et al.

(10) Patent No.: US 7,002,233 B2
(45) Date of Patent: Feb. 21, 2006

(54) INTEGRATED CIRCUIT INCLUDING AN INDUCTIVE ELEMENT HAVING A LARGE QUALITY FACTOR AND BEING HIGHLY COMPACT

(75) Inventors: Benoît Butaye, Caen (FR); Patrice Gamand, Douvres la Delivrande (FR)

(73) Assignee: Koninklijke Philips Electronics, N.V., Eindhoven (NL)

( * ) Notice: Subject to any disclaimer, the term of this patent is extended or adjusted under 35 U.S.C. 154(b) by 861 days.

(21) Appl. No.: 09/883,438

(22) Filed: Jun. 18, 2001

(65) Prior Publication Data

US 2002/0063585 A1    May 30, 2002

(30) Foreign Application Priority Data

Jun. 20, 2000    (FR) .................................. 00 07864

(51) Int. Cl.
*H01L 29/00* (2006.01)
(52) U.S. Cl. ...................... 257/531; 257/528; 455/258; 455/257
(58) Field of Classification Search ............... 327/280, 327/290; 257/531, 508, E21.022, 528
See application file for complete search history.

(56) References Cited

U.S. PATENT DOCUMENTS 5,539,241 A * 7/1996 Abidi et al. ................ 257/531
5,884,990 A * 3/1999 Burghartz et al. .......... 336/200
6,160,303 A * 12/2000 Fattaruso .................... 257/531
6,529,720 B1 * 3/2003 Jovenin et al. ............. 455/318
6,566,731 B1 * 5/2003 Ahn et al. ................... 257/531
2002/0142512 A1 * 10/2002 Ma et al. ..................... 438/100

FOREIGN PATENT DOCUMENTS

EP          0855741 A1      7/1998
WO        WO9850956        11/1998

OTHER PUBLICATIONS

Patent Abstracts of Japan, Sugawara Satoshi, "Planar Inductor And Planar Transformer," Publication No. 11176639, Feb. 7, 1999, Application No. 09342540, Dec. 12, 1997.
Patent Abstracts of Japan, Saito Masanobu, "Inductance Device," Publication No. 103211802, Apr. 12, 1998, Application No. 09132498, May 22, 1997.
Patent Abstracts of Japan, Takeda Akira, "Semiconductor Device," Publication No. 02072660, Dec. 3, 1990, Application No. 63224257, Sep. 7, 1988.
Patent Abstracts of Japan, Arakawa Tatsumi, "Sheet Coil," Publication No. 61115302, Feb. 6, 1986, Application No. 59236681, Nov. 12, 1984.

* cited by examiner

*Primary Examiner*—George Eckert
*Assistant Examiner*—Mursalin Bin Hafiz

(57)    ABSTRACT

An integrated circuit including a substrate, a conductive layer, at least one inductive element superposed on the conductive layer and formed by a metallic turn having an outer contour and an inner contour, which bound between them a surface referred to as the radiation surface, and insulating material for insulating the conductive layer from the inductive element. The conductive layer has a surface substantially identical to the radiation surface.

20 Claims, 2 Drawing Sheets

Figure 1:
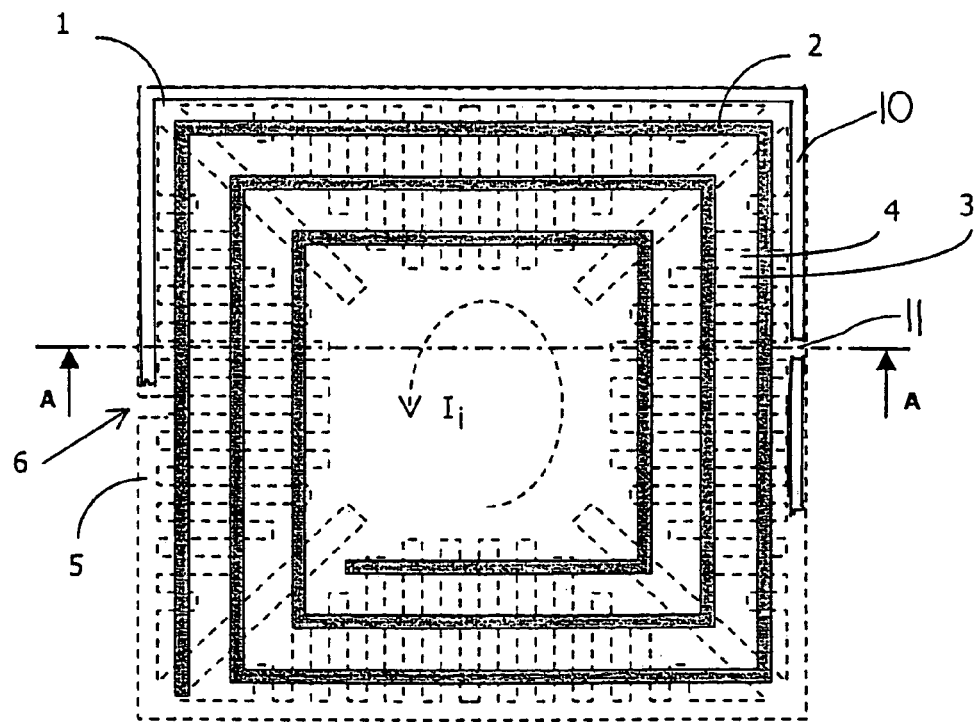

INTEGRATED CIRCUIT INCLUDING AN INDUCTIVE ELEMENT HAVING A LARGE QUALITY FACTOR AND BEING HIGHLY COMPACT

The invention relates to an integrated circuit comprising a substrate, a conductive layer, at least one inductive element superposed on said conductive layer and formed by a metallic turn having an outer contour and an inner contour, which bound between them a surface referred to as the radiation surface, and means for insulating the conductive layer from the inductive element.

Such an integrated circuit is known from the document PCT/US98/05149. The inductive element included in said integrated circuit has a high quality factor, which is obtained owing to the presence of a conductive shield interposed between the substrate and the inductive element. The known shield makes it possible to reduce, on the one hand, energy losses by reducing the currents that flow in the substrate caused by induction and, on the other hand, magnetic losses by limiting the pathlengths of these currents, which reduce the quality factor of the inductive element.

The invention takes account of the following considerations:

In the prior art the shield is realized by means of slices that occupy the entire surface bounded by the outer contour of the radiation surface. A surface, referred to as internal surface and bounded by the inner contour of the radiation surface, is a wasted surface inside the circuit, i.e. it cannot be used for purposes other than shielding.

It is an object of the invention to enable other elements to be integrated in a circuit of the type defined in the opening paragraph, without a resulting increase in the size of said circuit and without the operation of said other elements being impaired by the inductive element.

According to the invention, an integrated circuit as defined in the opening paragraph is characterized in that the conductive layer has a surface substantially identical to the radiation surface.

In an advantageous embodiment of the invention an active zone is integrated on a surface not covered by the radiation surface. In particular, this surface may be the internal surface. The active zone may then include capacitive, resistive or semiconductor elements. The invention can consequently be used in any integrated circuit which includes an inductive element in addition to other elements, regardless of whether these are capacitive, resistive or semiconductor elements.

In a special embodiment of the invention the conductive layer forms an open circuit. The object of this embodiment of the invention is to prevent a mutual inductance being formed between the inductive element and the superposed conductive layer. In this embodiment a current induced by the magnetic field generated by the inductive element cannot pass through the conductive layer forming an open circuit. Consequently, the mutual inductance existing between the conductive layer and the inductive element is very small.

More particularly, the conductive layer may include conductive segments. These conductive segments make it possible to minimize eddy currents produced by the magnetic field generated in the conductive layer by the inductive element. The conductive segments may be connected to a non-closed frame. The assembly then functions as an open circuit with respect to a current that could be induced therein.

In a preferred embodiment of the invention the substrate is formed with trenches perpendicular to the turn of the inductive element. The bottoms of these trenches is covered with a conductive material. The conductive layer is thus situated inside the substrate and forms a deep shield when it is connected to a circuit ground.

In an advantageous embodiment of the invention, the integrated circuit further includes a frame of a low-resistance or conductive material whose walls surround the inductive element completely, said frame having at least one slot over its entire height. The inductive element, when positioned in the neighborhood of another inductive element, creates a mutual inductance with this other inductive element. This mutual inductance tends to deteriorate the quality factor of the inductive element. The frame makes it possible to limit the occurrence of this effect by limiting the magnetic interaction of the inductive element with any other inductive element present in the circuit. A slot is formed over the entire height of the frame so as to prevent the formation of a current loop at the surface of the frame. Since the integrated circuit is formed by superposed layers, each made of a low-resistance or conductive material, the walls of the frame can be formed by a stack of tracks, each formed in one of said layers around a perimeter defined by the surface of the inductive element, said tracks being interconnected. The implementation of the frame by the use of existing layers does not lead to an increase in size of the circuit. Advantageously, the frame and the conductive layer may be interconnected to the same reference potential terminal, for example the circuit ground, in order to preclude the formation of parasitic capacitances.

In a variant of the invention, the integrated circuit comprises two inductive elements, the two being connected between a potential terminal which, depending on the requirements imposed on the circuit, may be either a supply terminal VCC of fixed or variable potential, or a terminal at a reference or ground potential GND, and a terminal which connects the inductive element to a circuit. They are arranged to allow the passage of a current I which flows between said terminals. These two inductive elements are symmetrical and are each formed by a single and similar turn. The choice of the structure of this turn influences the value of the mutual inductance which is formed when a current passes through the turn and, consequently, influences the values of the quality factors of the inductive elements formed with the aid of the turn. This choice is made so as to optimize the quality factors of the inductive elements. Said turn will advantageously be surrounded by a frame as described above in order to maximize the reduction of the electromagnetic interactions between said inductive elements and other elements of the circuit.

The present invention may be utilized in any integrated circuit in which an inductive element exists side by side with other elements, whether they are capacitive, resistive or semiconductor elements. The integrated circuit may be, for example, an oscillator, an active-load mixer, or a filter. In one of its applications, the invention therefore also relates to an oscillator adapted to supply an output signal having a frequency whose value depends on the value of a tuning voltage, characterized in that the oscillator is realized in the form of an integrated circuit in accordance with the invention as defined hereinbefore, which further includes at least a varicap diode connected to the inductive element and arranged to be biased by means of the tuning voltage.

More generally, the present invention may advantageously be used in an apparatus for receiving radio signals. The invention therefore relates to a radio signal receiving apparatus comprising:

an antenna and filter system enabling the reception of a signal, whose frequency, called radio frequency, is selected within a given frequency range, and the transformation of said signal into an electronic signal called radio signal, a local oscillator whose frequency, called oscillation frequency, can be tuned as a function of a tuning voltage, and a mixer arranged to receive the radio signal and a signal coming from the local oscillator and to supply an output signal having a fixed frequency equal to the difference between the radio frequency and the oscillation frequency, and a signal processing unit arranged to utilize the output signal of the mixer, which apparatus is characterized in that the local oscillator conforms to the oscillator described hereinbefore.

Figure 2:
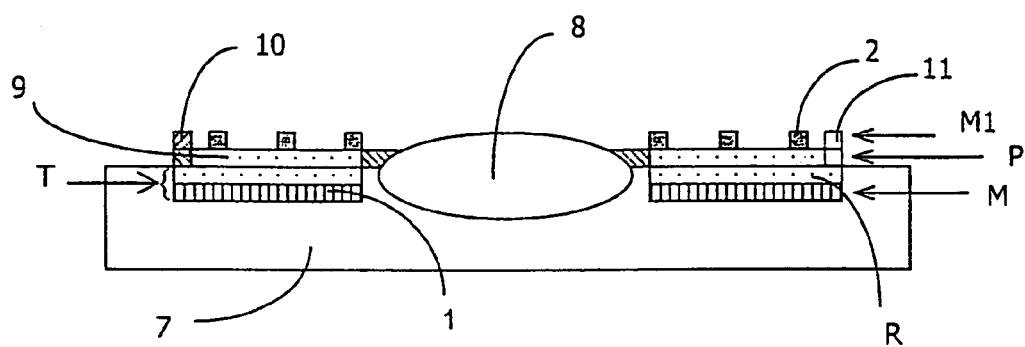
Figure 3:
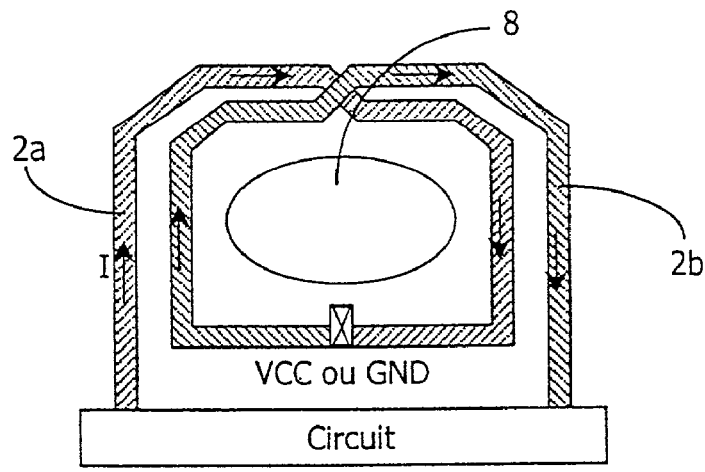
Figure 4:
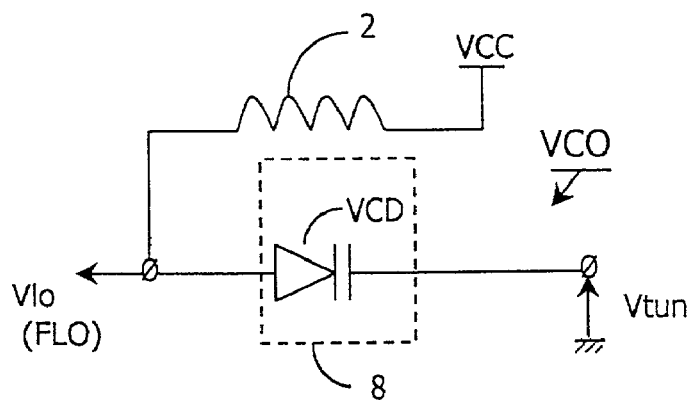
Figure 5:
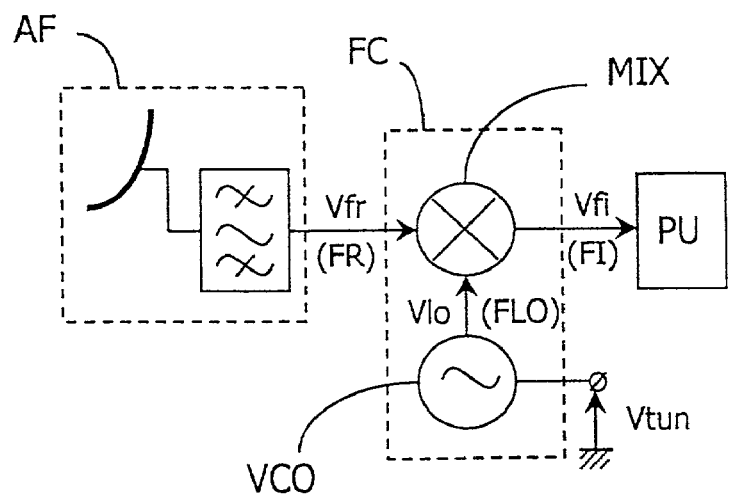

The invention will be more fully understood with the aid of the following description of some embodiments given by way of non-limitative example with reference to the accompanying drawings, in which:

FIG. 1 is a plan view of an integrated circuit in accordance with an advantageous embodiment of the invention (and shows a frame of an inductive element of the integrated circuit partially broken away), FIG. 2 is a sectional view of an integrated circuit in accordance with a preferred embodiment of the invention, FIG. 3 is a plan view of two inductive elements present in a circuit in accordance with a variant of the invention, FIG. 4 is a functional diagram of an oscillator in accordance with a special embodiment of the invention, and FIG. 5 is a functional diagram of a radio signal receiving apparatus including such an oscillator.

FIG. 1 shows an integrated circuit comprising a conductive layer 1 and an inductive element 2 superposed on said conductive layer. The inductive element 2 is formed by a metallic turn having an outer contour and an inner contour, which bound between them a surface referred to as the radiation surface, and means for insulating the conductive layer from the inductive element. The surface of the conductive layer 1, shown here in broken lines, is substantially identical to the radiation surface of the inductive element 2. This enables the integration of circuit elements on an internal surface bounded by the inner contour of the inductive element. This conductive layer 1 is made of a low-resistance or conductive material and is arranged perpendicularly to the vectors of the magnetic field produced by the inductive element 2. It may comprise an alternation of bands 3 and slots 4. The bands 3, which form conductive segments, are made of, for example, a metallic alloy or polysilicon. As the conductive layer is disposed perpendicularly to the vectors of the magnetic field produced by the inductive element, an induced current I; could appear in the plate if the plate were made in one piece. The alternation of slots 4 and bands 3 oriented perpendicularly to this current I forms an open circuit preventing the flow of this induced current. As this current is nearly zero in the conductive layer, the mutual inductance that may appear between said layer and the inductive element is also nearly zero and does not significantly affect the quality factor of the inductive element. At the outside the bands are connected to a frame 5 which is not closed. A slot 6 in the frame 5 prevents the formation of a current loop on the frame.

FIG. 2 is a sectional view of an integrated circuit in a preferred embodiment of the invention, taken in a plane defined by A—A in FIG. 1. Said FIG. is merely illustrative of a special method of realizing the conductive layer 1 described with reference to FIG. 1. The conductive layer 1 comprises a substrate 7 which may be connected to a reference potential terminal and in which trenches T are formed, which trenches T are perpendicular to the turn of the inductive element 2. The bottoms of these trenches T are covered with a low-resistance or conductive material M. Thus, a conductive layer 1 as shown in FIG. 1 can be obtained. Finally, these trenches are filled with a high-resistance or insulating material forming an insulating layer R.

By means of the substrate and a first conductive layer P it is possible to form, in the free space in the center of the turn of the inductive element, an active zone 8 which may comprise active, passive and semiconductor elements.

As a result of its design, the conductive layer P, which is generally made of silicon, has a special structure which meets the requirements imposed on the circuit: since it occupies only a portion of the total area of the circuit, this structure has interstices. In particular, the surface where the inductive element is to be integrated covers such an interstice. A high-resistance or insulating material fills these interstices, thereby forming an insulating layer 9 at the same level as the conductive layer P.

In the integrated circuit described here, the inductive element is formed in the material, for example a metal alloy of the aluminum type, which forms a second conductive layer M1 of the circuit, in such a manner that the inductive element 2 is coiled around the active zone 8.

In the embodiment described here, the conductive layer 1 does not adjoin the inductive element 2. The second layer M1, in which the inductive element 2 is incorporated, and the conductive layer 1 incorporated in the substrate 7, are actually separated by the insulating layers R and 9. The inductive element 2 and the conductive layer 1, considered together, can form an L-C element. A capacitance C formed between the inductive element 2 and said conductive layer 1 degrades the quality factor of the inductive element 2. The value of this capacitance is a function of the distance separating the conductive layer 1 from the inductive element 2. To minimize this value, the conductive layer 1 is situated as far as possible from the inductive element 2. The quality factor will be further improved if the conductive layer is made of a low-resistance or conductive material, as is the case in the present example. The connection of the conductive layer 1 to the reference terminal also enables the value of said parasitic capacitance to be limited. In the case of a conductive layer 1 formed in the substrate 7, as described hereinbefore, the contact between the conductive layer 1 and any other conductive element provided on the surface of the substrate is made with the aid of a low-resistance or conductive material deposited on the inner walls of the trenches T during the fabrication of the conductive layer 1, by deposition of this material on the bottoms of the trenches. The contact with a conductive element situated on the surface of the substrate is subsequently made at the edges of said trenches T by a metallic connection.

The quality factor of the inductive element 2 may also be affected by the presence of a second capacitance, which may be formed between the conductive layer 1 and the substrate 7. By now connecting the conductive layer 1 and the substrate 7 to the same potential terminal, the formation of this second parasitic capacitance can be precluded and the quality factor of the inductive element 2 does not deteriorate.

In the embodiment described here, a frame 10 made of a conductive material is formed around the inductive element 2. Over its entire height, the frame 10 has a slot 11, which is indicated by a non-hatched area in FIG. 2, yielding a partial section, which slot interrupts any possible flow of current induced by the inductive element 2 it surrounds. This frame 10 enables the mutual inductances between the inductive element 2 and circuit elements in the proximity of said inductive element to be minimized. In the embodiment described here, the frame 10 is realized by junctions of parts of the layers P and M1. The frame 10 is sufficiently high to ensure a proper insulation between the inductive element 2 and the rest of the circuit and thus limit the magnetic interaction. In general terms, each inductive element or part of an inductive element included in the integrated circuit can be insulated by such a frame, so as to minimize the mutual inductances that may be formed between this inductive element or part of an inductive element and other elements present in the circuit.

In a preferred embodiment of the invention, the conductive layer 1 and the frame 10 are together connected to a reference potential terminal. The parasitic capacitive couplings between the conductive layer 1 and the substrate 7 on the one hand, between the conductive layer 1 and the inductive element 2 on the other and, finally, between the conductive layer 1 and the frame 10, are thus limited considerably. The inductive elements included in this variant of the integrated circuit in accordance with the invention will then have a high quality factor.

FIG. 3 is a plan view of two inductive elements included in an integrated circuit in accordance with a variant of the invention. The present circuit comprises a single turn. This turn includes two inductive elements 2a, 2b, hatched differently in the Figure. These two inductive elements are symmetrical and arranged one in the other. They are both connected between a potential terminal, which can be either a supply terminal VCC of fixed or variable potential, depending on the requirements of the circuit, or a reference potential or ground terminal GND, and a terminal which connects the inductive element 2 to a circuit, which inductive elements are arranged to have a current I flow through them between said terminals. In these two inductive elements the current flows in the same direction at any instant, as is shown in FIG. 3. The mutual inductance between two adjacent parallel conductor wires depends on the direction of the current path. When the directions of the current paths are opposed the mutual inductance is subtracted from the self-inductance of each wire. When the directions of the current paths are identical the mutual inductance is added to the self-inductance of each wire. In the structure proposed here, currents having the same direction flow through the adjacent turn portions: the inductances of the two inductive elements and their quality factors are thus increased. As a result, the performance of the circuit is improved. In an application of the invention a conductive layer as shown in FIG. 1 is realized advantageously by superposing said conductive layer and the turn forming the two inductive elements 2a and 2b. This structure provides an internal surface on which an active zone 8 can be integrated.

FIG. 4 is a functional diagram of an oscillator VCO realized in the form of an integrated circuit according to the invention. This oscillator VCO serves to produce a voltage signal Vlo having a frequency FLO whose value depends on a tuning voltage Vtun. This oscillator comprises an inductive element 2 connected to a supply terminal VCC, and an active zone 8 comprising a varicap diode VCD. Since the varicap diode VCD has a capacitance which is variable in dependence on its bias voltage, the resonant frequency of the L-C circuit is also variable.

FIG. 5 diagrammatically shows an apparatus for receiving radio signals, comprising an antenna and filter system AF, enabling the reception of a radio signal whose frequency FR, called radio frequency, is selected within a given range of frequencies, and its conversion into an electronic signal Vfr, called radio signal. This receiving apparatus further includes a frequency converter FC which includes a local oscillator VCO and a mixer MIX which is arranged to receive the radio signal Vfr and a signal Vlo coming from the local oscillator VCO whose frequency FLO, called oscillation frequency, is controllable, and which is adapted to deliver an output signal Vfi having a frequency FI which is fixed and equal to the difference between the radio frequency FR and the oscillation frequency FLO.

In this frequency converter FC, the choice of the value of the oscillation frequency FLO, made by means of a tuning voltage Vtun, defines the value of the radio frequency FR, because the intermediate frequency FI is fixed, for example, by means of a filter system not shown in the Figure and arranged at the output of the mixer MIX. This receiving apparatus finally includes a signal processing unit PU arranged to utilize the output signal of the mixer MIX.

The invention enables a high spectral purity to be achieved for the output signal of the local oscillator VCO owing to the large quality factor of the inductive elements included in said oscillator. The spectral purity allows an accurate selection of the radio frequency to be obtained and, thanks to the invention, it is not obtained at the expense of a large size of the local VCO.

The invention claimed is:

1. An integrated circuit comprising:
   a substrate,
   a conductive layer arranged in connection with the substrate,
   at least one inductive element superposed on the conductive layer and formed by a metallic turn having an outermost contour and an innermost contour, which bound between them a surface referred to as a radiation surface, the turn of the at least one inductive element having a free space in a center defining an active zone which is not covered by the radiation surface, the active zone being receivable of capacitive, resistive or semiconductor elements, and
   means for insulating the conductive layer from the at least one inductive element,
   the conductive layer having a surface substantially identical to the radiation surface such that the conductive layer is situated around the active zone which is not covered by the radiation surface.

2. An integrated circuit as claimed in claim 1, wherein the active zone comprises capacitive, resistive or semiconductor elements.

3. An integrated circuit as claimed in claim 1, wherein the conductive layer includes bands separated by slots and which are oriented perpendicular to the at least one inductive element.

4. An integrated circuit as claimed in claim 1, further comprising a frame of a low-resistance or conductive material which has walls surrounding the at least one inductive element completely, said frame having at least one slot over its entire height.

5. An integrated circuit as claimed in claim 1, wherein the at least one inductive element comprises two inductive elements connected between a terminal at a given potential and a terminal that connects the inductive elements to a circuit, said inductive elements each being formed by a single and similar turn.

6. An integrated circuit as claimed in claim 1, wherein the at least one inductive element is not superimposed on the active zone.

7. An integrated circuit as claimed in claim 1, wherein the conductive layer includes bands separated by slots, the bands extending to but not into the active zone such that the active zone is surrounded by the bands.

8. An integrated circuit as claimed in claim 1, wherein the turn of the at least one inductive element terminates at an innermost point over part of the conductive layer outside of the active zone.

9. An integrated circuit as claimed in claim 1, wherein the conductive layer is formed to occupy only a portion of the total area of the integrated circuit and does not occupy a portion in a center of the integrated circuit including the active zone.

10. An integrated circuit as claimed in claim 1, wherein the active zone is bounded by the innermost contour of the turn of the at least one inductive element.

11. An integrated circuit as claimed in claim 1, wherein the active zone is formed on the substrate.

12. An integrated circuit as claimed in claim 1 wherein the at least one inductive element is coiled around the active zone.

13. An integrated circuit as claimed in claim 1, further comprising an insulating layer interposed between the at least one inductive element and the conductive layer, the insulating layer surrounding the active zone.

14. An integrated circuit as claimed in claim 1, further comprising capacitive, resistive or semiconductor elements arranged on the substrate in the active zone.

15. An integrated circuit as claimed in claim 1, wherein the conductive layer includes conductive segments.

16. An integrated circuit as claimed in claim 15, wherein the conductive segments are connected to a non-closed frame.

17. An integrated circuit as claimed in claim 15, wherein the substrate is formed with trenches perpendicular to the turn of the at least one inductive element, the bottoms of said trenches being covered with a low-resistance or conductive material, which forms the conductive layer.

18. An oscillator adapted to supply an output signal having a frequency whose value depends on the value of a tuning voltage, wherein the oscillator is realized in the form of an integrated circuit as claimed in claim 1, and the active zone includes at least one varicap diode connected to the at least one inductive element and arranged to be biased by means of the tuning voltage.

19. An apparatus for receiving signals, comprising:

an antenna and filter system enabling reception of a radio signal whose radio frequency is selected within a given frequency range, and its conversion into an electronic radio signal, a local oscillator having an oscillation frequency controllable by means of a tuning voltage, a mixer adapted to receive the radio signal and a signal coming from the local oscillator and to supply an output signal having a fixed frequency equal to the difference between the radio frequency and the oscillation frequency, and a signal processing unit adapted to utilize the output signal of the mixer, wherein the local oscillator is an oscillator as claimed in claim 9.

20. An integrated circuit comprising:

a substrate, a conductive layer, at least one inductive element superposed on the conductive layer and formed by a metallic turn having an outermost contour and an innermost contour, which bound between them a surface referred to as a radiation surface, the innermost contour defining an active zone on the substrate which is not covered by the radiation surface, and means for insulating the conductive layer from the at least one inductive element, the conductive layer having a surface substantially identical to the radiation surface, the at least one inductive element comprising two inductive elements connected between a terminal at a given potential and a terminal that connects the inductive elements to a circuit, said inductive elements each being formed by a single and similar turn.

* * * * *